United States Patent
Zhu et al.

(10) Patent No.: US 6,721,589 B1
(45) Date of Patent: Apr. 13, 2004

(54) RAPID THREE-DIMENSIONAL MAGNETIC RESONANCE TAGGING FOR STUDYING MATERIAL DEFORMATION AND STRAIN

(75) Inventors: Yudong Zhu, Clifton Park, NY (US); Christopher Judson Hardy, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 183 days.

(21) Appl. No.: 09/617,951

(22) Filed: Sep. 6, 2000

Related U.S. Application Data

(60) Provisional application No. 60/168,123, filed on Nov. 30, 1999.

(51) Int. Cl.[7] .............................................. A61B 5/055
(52) U.S. Cl. ...................... 600/413; 324/307; 324/309; 600/410
(58) Field of Search ................................. 600/407, 413, 600/410; 324/307, 309

(56) References Cited

U.S. PATENT DOCUMENTS

| | | | |
|---|---|---|---|
| 4,484,138 A | 11/1984 | Bottomley et al. | 324/307 |
| 4,535,290 A | 8/1985 | Post et al. | 324/309 |
| 4,752,734 A | 6/1988 | Wedeen | 324/306 |
| 4,953,554 A | 9/1990 | Zerhouni et al. | 128/653 A |
| 5,054,489 A | 10/1991 | Axel et al. | 128/653 |
| 5,111,820 A | 5/1992 | Axel et al. | 128/653 A |
| 5,217,016 A * | 6/1993 | Axel et al. | 600/410 |
| 5,275,163 A * | 1/1994 | McKinnon et al. | 324/309 |
| 5,320,099 A * | 6/1994 | Roberts et al. | 324/306 |
| 5,339,035 A | 8/1994 | Schneider et al. | 324/309 |
| 5,379,766 A * | 1/1995 | McKinnon et al. | 324/309 |
| 5,417,214 A | 5/1995 | Roberts et al. | 128/653.3 |
| 5,474,067 A * | 12/1995 | Laub | 600/413 |
| 6,171,241 B1 * | 1/2001 | McVeigh et al. | 324/309 |
| 6,271,665 B1 * | 8/2001 | Berr et al. | 324/306 |
| 6,295,464 B1 * | 9/2001 | Metaxas | 250/363.03 |
| 6,453,187 B1 * | 9/2002 | Prince et al. | 600/410 |

OTHER PUBLICATIONS

Walter J. Rogers Jr. et al., "Quantification of and Correction for Left Ventrical Systolic Long–Axis Shortening by Magnetic Resonance Tissue Tagging and Slice Isolation", *Circulation*, vol. 84, No. 2, Aug. 1991.

Leon Axel PhD, MD and Lawrence Dougherty, BS, "Heart Wall Motion: Improved Method of Spatial Modulation of Magnetization for MR Imaging", Cardiac Radiology, Aug. 1989, pp. 349–350.

Stefan E. Fischer et al., "Improved Myocardial Tagging Contrast", Magn. Reson. Med, 30, (1993), pp. 191–200.

Stefan E. Fischer et al., "True Myocardial Motion Tracking", Magn. Reson. Med, 31, (1994), pp. 401–413.

* cited by examiner

*Primary Examiner*—Eleni Mantis Mercader
*Assistant Examiner*—Runa Shah Qaderi
(74) *Attorney, Agent, or Firm*—Jean K. Testa; Patrick K. Patnode

(57) ABSTRACT

A method for producing an image of a selected region of interest included in a volume within a moving and deforming object in a Magnetic Resonance Imaging (MRI) system includes applying at least one integrated preparatory pulse sequence to the region of interest prior to any subsequent imaging sequences. The integrated preparatory pulse sequence is adapted to simultaneously, alter longitudinal magnetization of spins located outside of the selected region and to further impose a grid pattern on the selected region. The integrated preparatory pulse sequence is subsequently followed by a projection imaging technique.

16 Claims, 9 Drawing Sheets

RAPID THREE-DIMENSIONAL MAGNETIC RESONANCE TAGGING FOR STUDYING MATERIAL DEFORMATION AND STRAIN

CROSS REFERENCE TO RELATED APPLICATIONS

Continuity Statement

This application is related to Provisional Application U.S. Serial No. 60/168,123, filed Nov. 30, 1999 in the U.S. Patent and Trademark Office, the contents of which are incorporated herein by reference, and the benefit of priority to which is claimed under 35 U.S.C. 119(e).

BACKGROUND OF INVENTION

This invention relates to magnetic resonance imaging (MRI) methods and systems and, more particularly, to the imaging of moving three-dimensional subjects such as myocardial wall.

In many clinical applications, high-resolution MR images of moving three-dimensional (3D) objects must be acquired. For example, it is desirable to acquire images of the myocardial wall, a three-dimensional object that-moves substantially during the cardiac cycle. Generally, a two-dimensional (2D) slice acquisition has been the typical technique to capture a portion of the subject myocardial wall in a 2D imaging plane at some point in the cardiac cycle. However, it may not always possible to capture the same portion at other cardiac phases because the wall region moves in and out of the 2D slice constantly as the heart beats.

MR tagging is a promising technique for non-invasively studying regional heart wall motion both at rest and during stress. With this technique, following the establishment of a number of tags in the myocardium through spatially dependent excitation (usually applied immediately after the R-wave), a sequence of images is acquired at various phases of the cardiac cycle. These images capture the time-varying configuration of the fiducial marks as they deform along with the myocardium and intersect with the imaging plane (s), allowing the myocardial deformation be examined and the motion of individual segments to be tracked. Extensive efforts have been directed towards designing and validating various tagging schemes suitable for quantifying complex myocardial motion. One very efficient scheme, called spatial modulation of magnetization (SPAMM), uses short RF pulses with interleaved gradient pulses to simultaneously generate a set of parallel tags. Some other schemes tag the myocardium with different patterns, e.g., radial tags, which are also suitable for examining the heart geometry.

Use of MR tagging for studying complex heart wall motion generally requires the acquisition of time-resolved volumetric data that capture the 3D motion of the tags. Nevertheless, even on a state-of-the-art MR scanner, the volumetric imaging protocol is too time-consuming to be feasible or of much clinical utility. As a compromise, one typically uses instead a planar imaging protocol, which is imaging a fixed plane (thin slice) in 3D at various phases of the cardiac cycle. With interactive graphic prescription one can specify a plane that contains the myocardial region of interest at a certain cardiac phase. As a consequence of through-plane motion of the heart, however, this approach of focusing on a plane fixed in space is generally limited in its ability to capture the same myocardial region (and embedded tag segments) at other cardiac phases. Thus, the region of interest generally moves constantly in and out of the image plane as the heart beats, and the data acquired at a given cardiac phase only portray the deformation state of a myocardial region (and embedded tag segments) that occurs in that image plane at that phase.

What is needed is an MR imaging method that keeps a moving and deforming region of interest in view, so as to result in an image or series of images that capture the moving and deforming region of interest and any imposed tags over an extended portion of the cardiac cycle.

SUMMARY OF INVENTION

A method for producing an image of a selected region of interest within a moving and deforming object in a Magnetic Resonance Imaging (MRI) system includes applying at least one integrated preparatory pulse sequence to the region of interest prior to any subsequent imaging sequences. The integrated preparatory pulse sequence is adapted to simultaneously alter longitudinal magnetization of spins located outside of the selected region and to further impose a grid pattern on the selected region.

DETAILED DESCRIPTION

Figure 1:
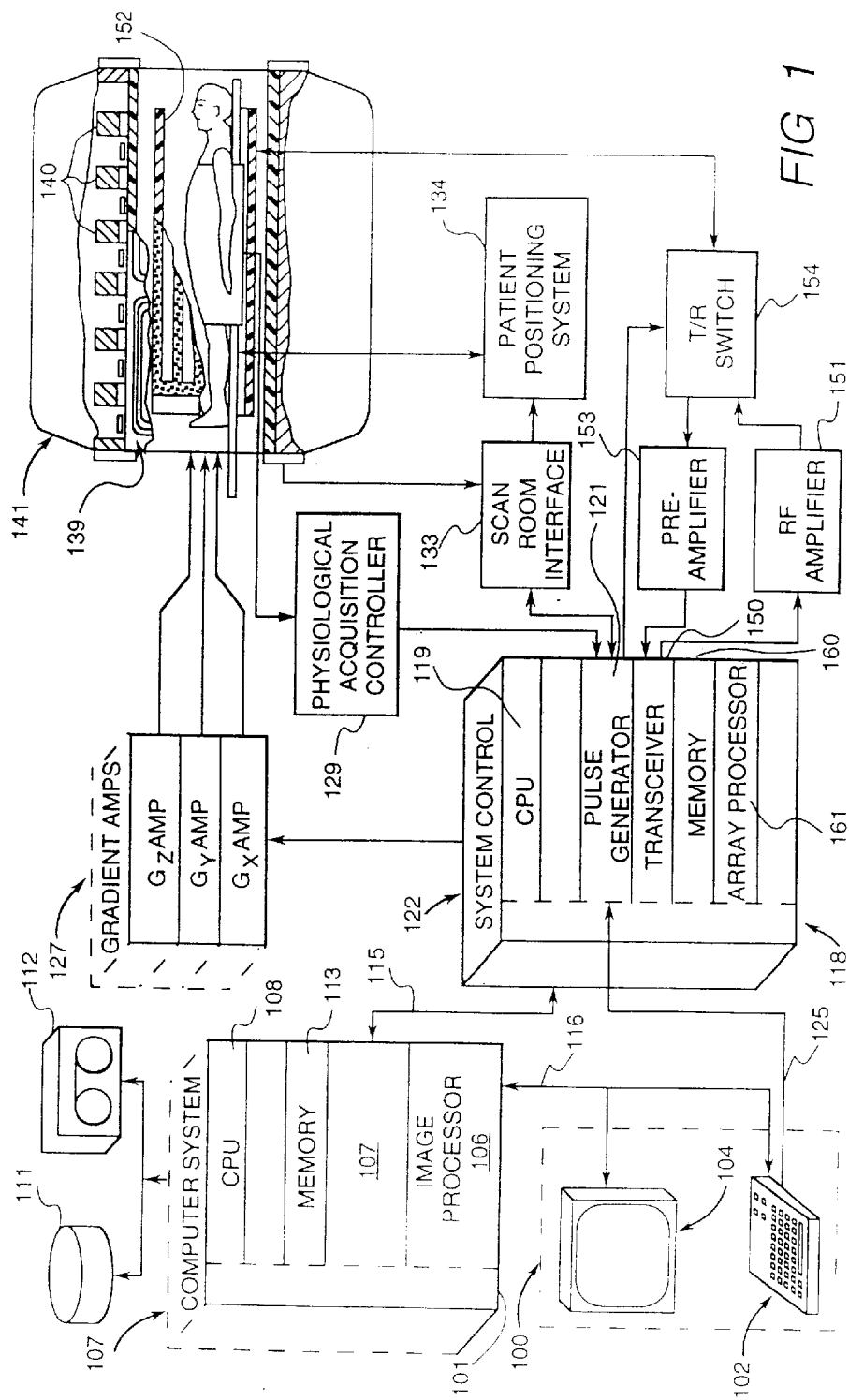
FIG. 1 is a block diagram of a MRI system employing the invention.

FIG. 1 shows the major components of a MRI system that incorporates the present invention. Operation of the system is controlled from an operator console 100 that includes a keyboard and control panel 102 and a display screen 104. Console 100 communicates through a link 116 with a separate computer system 107 that enables an operator to control the production and display of images on screen 104. Computer system 107 includes a number of modules that communicate with each other through a first backplane 101. These modules include an image processor 106, a CPU (central processing unit) 108 and a memory 113, known in the art as a frame buffer, for storing image data arrays. Computer system 107 is linked to a disk storage 111 and a tape drive 112 for storing of image data and programs, and communicates with a separate system control 122 through a high speed serial link 115.

System control 122 includes a set of modules coupled together by a second backplane 118. These modules include a CPU 119 and a pulse generator 121 coupled to operator console 100 through a serial link 125. System control 122 receives, through line 125, commands from the operator that indicate the scan sequence to be performed.

Pulse generator module 121 operates the system components to carry out the desired scan sequence, producing data which designate the timing, strength and shape of the RF pulses to be produced, and the timing and length of the data acquisition window. Pulse generator module 121 is coupled to a set of gradient amplifiers 127 to designate the timing and shape of the gradient pulses to be produced during the scan. Pulse generator module 121 also receives patient data from a physiological acquisition controller 129 that receives signals from various sensors attached to the patient, such as ECG (electrocardiograph) signals from electrodes that synchronize operation of pulse generator module 121 with the cardiac cycle of the patient. Pulse generator module 121 is coupled to a scan room interface circuit 133 which also receives signals from various sensors associated with the condition of the patient and the magnet system. Patient positioning system 134 receives, through scan room interface circuit 133, commands to move the patient to the desired position for the scan.

The gradient waveforms produced by pulse generator module 121 are applied to gradient amplifier system 127 comprised of $G_x$, $G_y$ and $G_z$ amplifiers. Each gradient amplifier excites a corresponding gradient coil in an assembly 139 to produce the magnetic field gradients used for position encoding acquired signals. Gradient coil assembly 139 forms part of a magnet assembly 141 which includes a polarizing magnet 140 and a whole-body RF coil 152. A transceiver module 150 in system control 122 produces pulses which are amplified by a RF amplifier 151 and supplied to RF coil 152 by a transmit/receive switch 154. The resulting signals radiated by the excited nuclei in the patient may be sensed by the same RF coil 152 and supplied through transmit/receive switch 154 to a preamplifier 153. The amplified MR signals are demodulated, filtered, and digitized in the receiver section of transceiver 150. Transmit/receive switch 154 is controlled by a signal from pulse generator module 121 to electrically couple RF amplifier 151 to coil 152 during the transmit mode and to preamplifier 153 during the receive mode. Transmit/receive switch 154 also enables a separate RF coil (for example, a head coil or surface coil) to be used in either the transmit or receive mode.

The MR signals picked up by RF coil 152 are digitized by transceiver module 150 and transferred to a memory module 160 in system control 122. When the scan is completed and an entire array of data has been acquired in memory module 160, an array processor 161 operates to Fourier transform the data into an array of image data which are conveyed through serial link 115 to computer system 107 for storage in disk memory 111. In response to commands received from operator console 100, the image data may be archived on tape drive 112, or may be further processed by image processor 106 and conveyed to operator console 100 for presentation on display screen 104.

The moving object to be imaged in an embodiment of the invention is a region of the myocardial wall of a human subject. The myocardial wall surrounds the left ventricle and moves in space as the heart beats. It can be appreciated that the invention is readily applicable in other MR applications that investigate motion and deformation.

Figure 2:
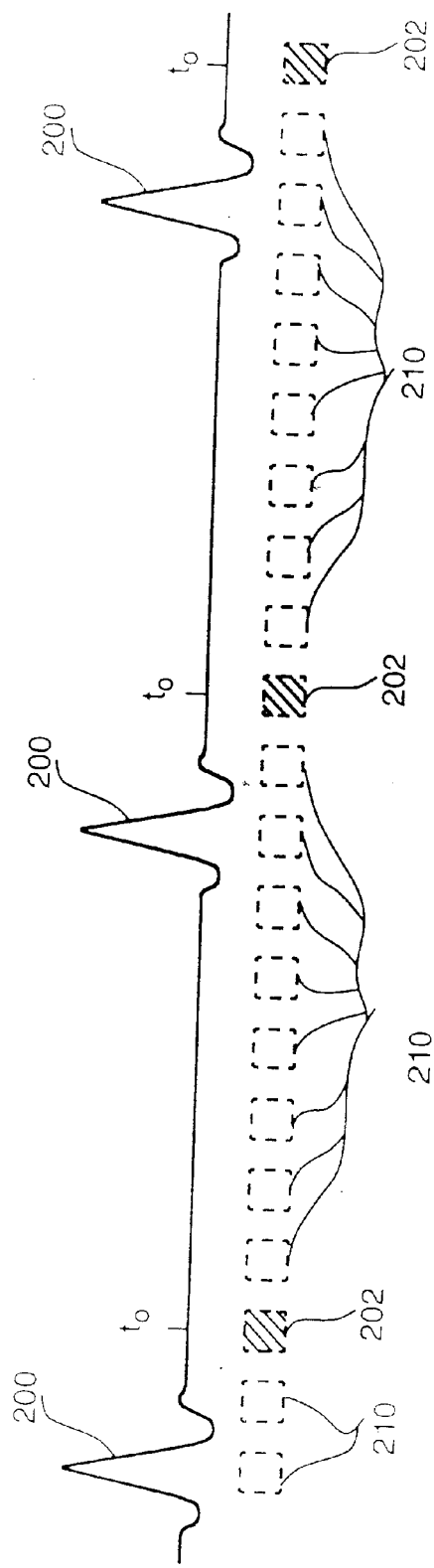
FIG. 2 is graphical representation of a cardiac-triggered image acquisition sequence useful in the MRI system of FIG. 1.
Figure 3:
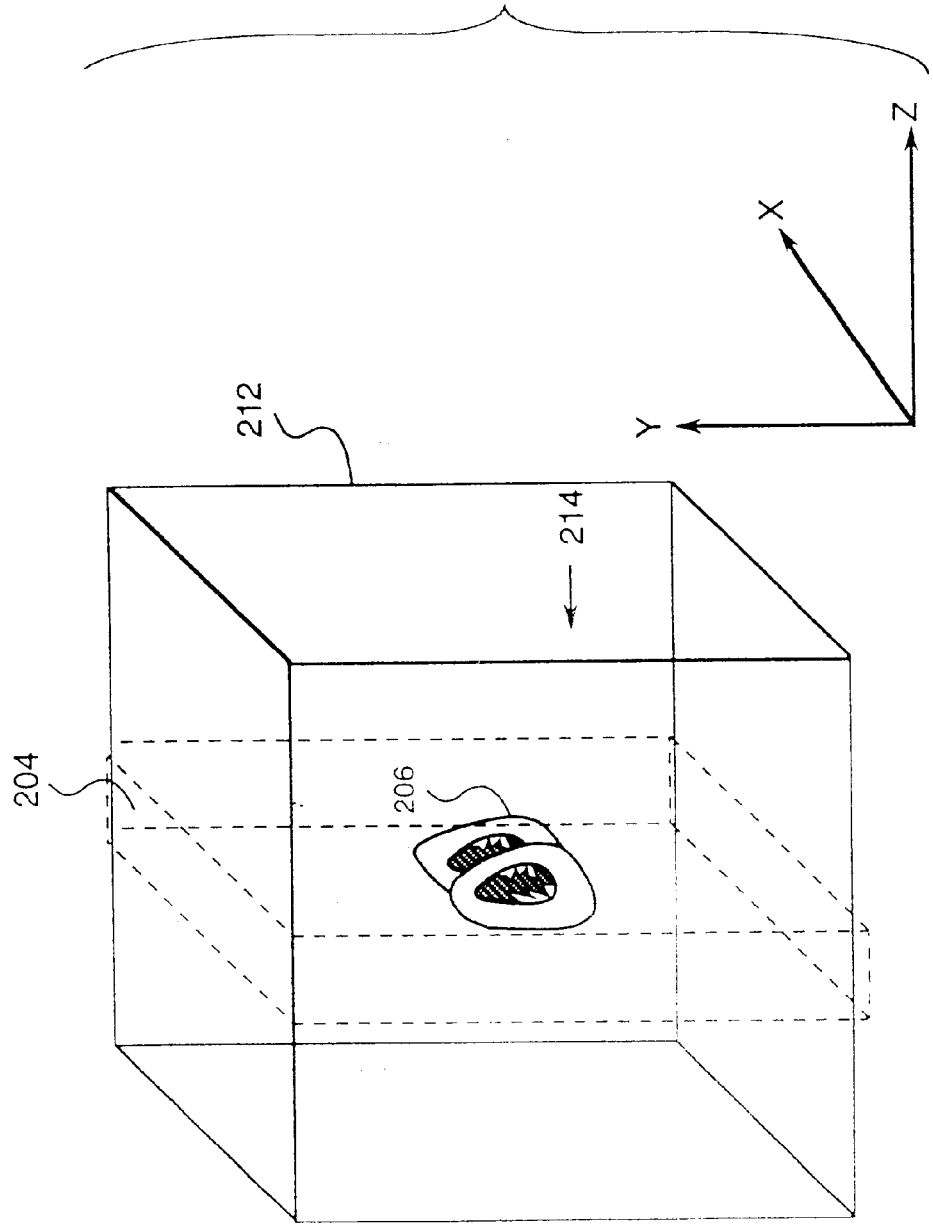
FIG. 3 is a pictorial representation of a sliced region of the myocardium to be imaged at one cardiac phase.
Figure 4:
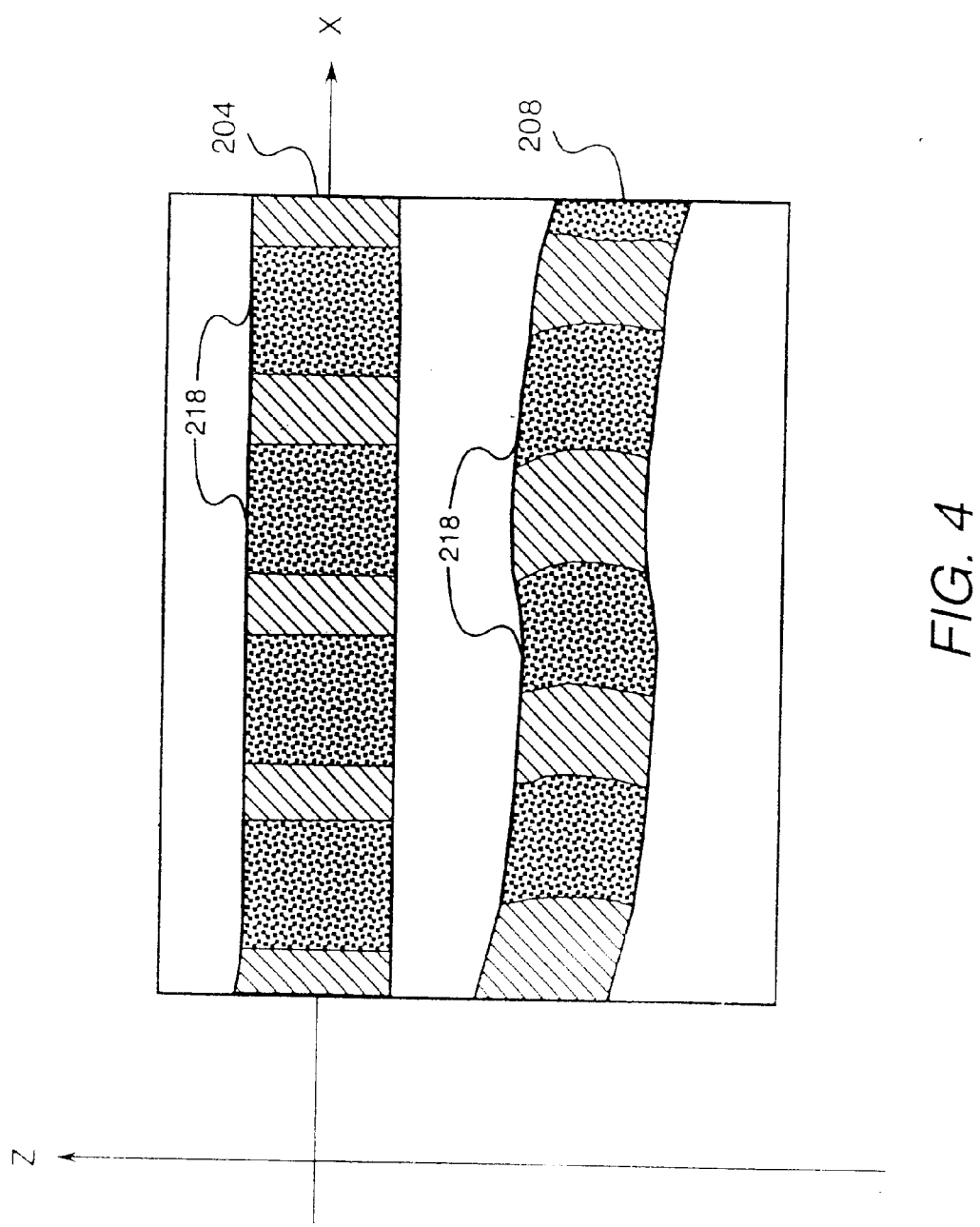
FIG. 4 is a pictorial representation of a tagged region of the slice of FIG. 3.

Referring to FIGS. 2, 3 and 4, a typical data acquisition technique is shown. Generally data acquisition during MR imaging of a moving heart is synchronized with the beat of the patient's heart by an ECG signal that produces cardiac gating signals for pulse generator module 121 (FIG. 1) after the peak of R-waves 200 (as shown in FIG. 2). Referring further to FIG. 2, at a pre-selected time $t_0$ after each cardiac gating signal, a preparation pulse sequence 202 is performed by the MRI system. Typically, this preparation pulse sequence defines a selected region which contains the myocardial wall segment to be imaged. As shown in FIG. 3, the selected region may be a planar section or slice 204 which includes a segment 206 of a myocardial wall. During subsequent phases of the cardiac cycle, a series of imaging pulse sequences 210 are performed by the MRI system. These imaging pulse sequences define a volume 212, shown in FIG. 3, which is larger than slice 204 and which includes myocardial wall segment 206 at any of its spatial locations during the cardiac cycle. These imaging pulse sequences acquire MR data from which images may be reconstructed using one of many well-known reconstruction techniques. Each image is a projection of MR signals from volume 212 as seen along a projection vector 214 and this projection can be acquired from any chosen direction. Even though myocardial wall segment 206 moves in and out of slice 204 during the cardiac cycle, each imaging pulse sequence acquires MR signals from the entire segment 206.

Alternatively, preparatory pulse sequence 202 of FIG. 2 additionally includes a tagging pulse sequence. Referring to FIG. 4, slice 204 (FIG. 3) is tagged with, for example, a spatial modulation of magnetization (SPAMM) pulse sequence, resulting in tagged segments 218.

Many different imaging pulse sequences may be employed to practice the invention. The particular sequence chosen will depend on the particular clinical application. In the exemplary embodiment of the present invention described herein, a multi-shot, interleaved, echo planar imaging (EPI) pulse sequence is used. However, it can be appreciated that the invention may be used with a wide range of imaging pulse sequences in which a moving object is to be imaged. For example, segmented fast-gradient echo sequences are also desirably used, as well as spiral k-space sampling pulse sequences.

Figure 5:
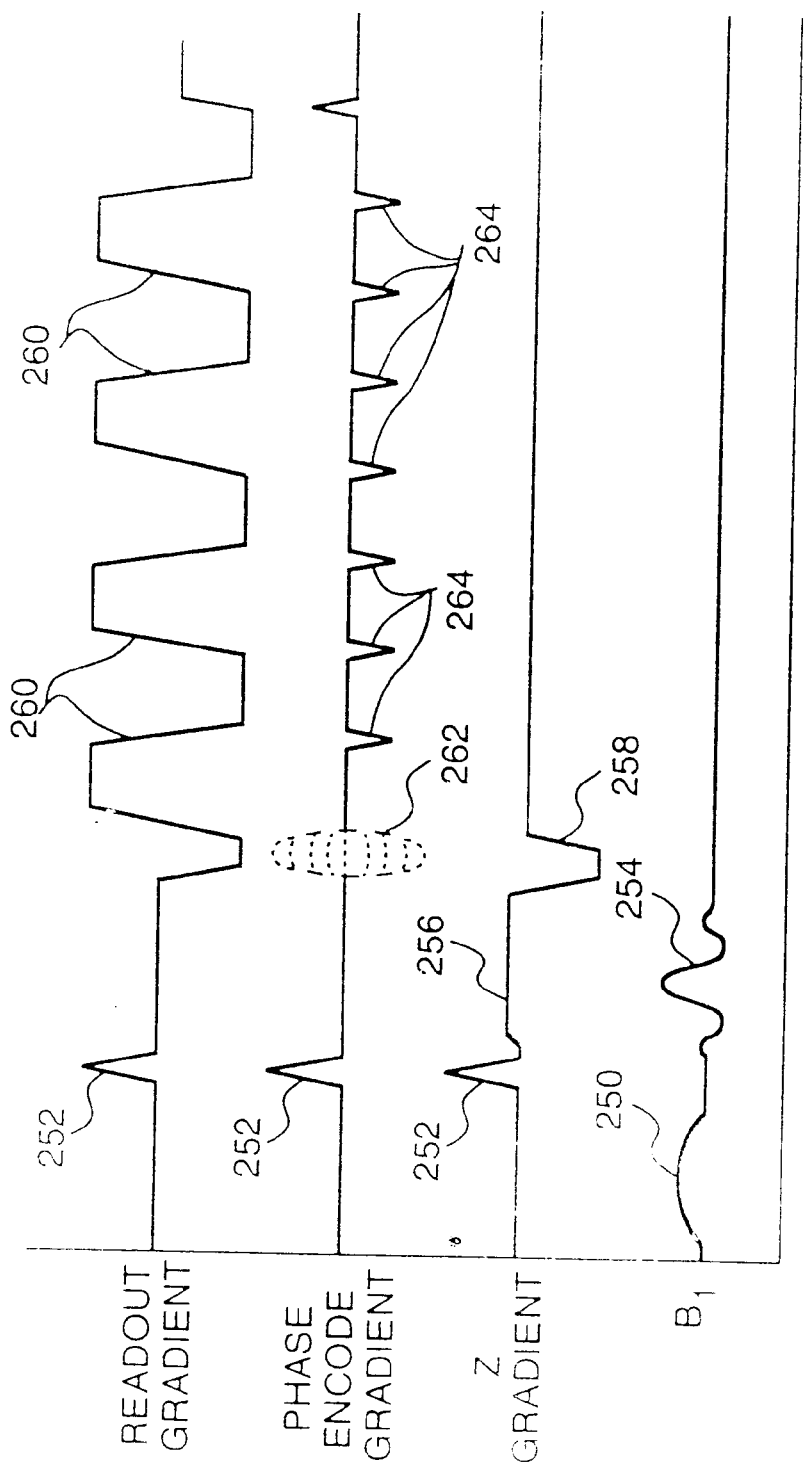
FIG. 5 is a graphical representation of a imaging pulse sequence useful in the image acquisition sequence of FIG. 2.

Referring to FIG. 5, the EPI pulse sequence is shown to include a spectrally selective RF saturation pulse 250 that is desirably tuned to saturate fat spins. A resulting transverse magnetization is dephased by magnetic field gradient pulses 252 which are applied along all three orthogonal gradient axes. This is followed by a selective RF excitation pulse 254 having a flip angle theta which is produced in the presence of a Z-axis magnetic field gradient pulse 256. The frequency content of RF pulse 254 and the amplitude of Z-axis gradient pulse 256 are chosen such that the entire volume 212 (FIG. 3) of spins is excited. Ideally, these values are prescribed such that the size of volume 212 along the Z-axis is slightly larger than the Z-axis movement of myocardial wall segment 206 during the entire cardiac cycle. A resulting transverse magnetization produced throughout volume 212 is then rephased by a negative Z-axis gradient pulse 258, shown in FIG. 5. The area within gradient pulse 258 is calculated to have a value different from that needed to exactly rephase the spin magnetization across the entire volume 212. This additional magnetic field gradient creates a small phase roll in the MR signals produced by spins disposed along the projection direction 214 (FIG. 3), causing suppression of unwanted signals across volume 212.

A readout gradient which alternates in polarity to form a series of positive and negative readout gradient lobes 260 is produced and a corresponding series of MR echo signals (not shown) are acquired and stored. A prephaser gradient pulse 262 is applied in the phase encoding direction and a series of phase encoding gradient pulses 264 are applied prior to each positive and negative readout gradient lobe 260 to uniquely phase encode each corresponding MR echo signal. As is well known in the art, the EPI pulse sequence is repeated (or "shot") a number of times, and prephaser gradient 262 is stepped through a corresponding set of values such that all of $k_y$ space is sampled in an interleaved manner. In this embodiment, anywhere from 1 to 8 MR signals, or views, are acquired during each EPI shot, and from 16 to 128 shots are acquired during the scan. Each EPI shot is acquired at the same cardiac phase during each of a corresponding number of successive cardiac cycles, and the resulting two-dimensional array of k-space data is Fourier transformed along the readout and phase-encoding axes to produce a two-dimensional image. This two-dimensional image is a projection along the Z-axis of all the spin signals in volume 212 (FIG. 3). As a result, the MR signals from all of myocardial wall segment 206 are projected onto this 2D image regardless of their location within volume 212 at the particular moment in the cardiac cycle that the MR signals are required.

If the imaging pulse sequence 210 (FIG. 2) is employed alone, the projection along the Z-axis through the entire volume 212 will include strong MR signals from spins throughout the volume. Such signals may obscure wall segment 206 unless they are suppressed. Preparation pulse sequence 202 of FIG. 2 is desirably adapted to suppress the MR signals from these other spins so that the clinically important myocardial wall segment 206 can be clearly seen in the projected image. As used herein "adapted to" and the like refer to processes having a structure (i.e. pulse sequence) and a capability for performing a stated function.

Figure 6:
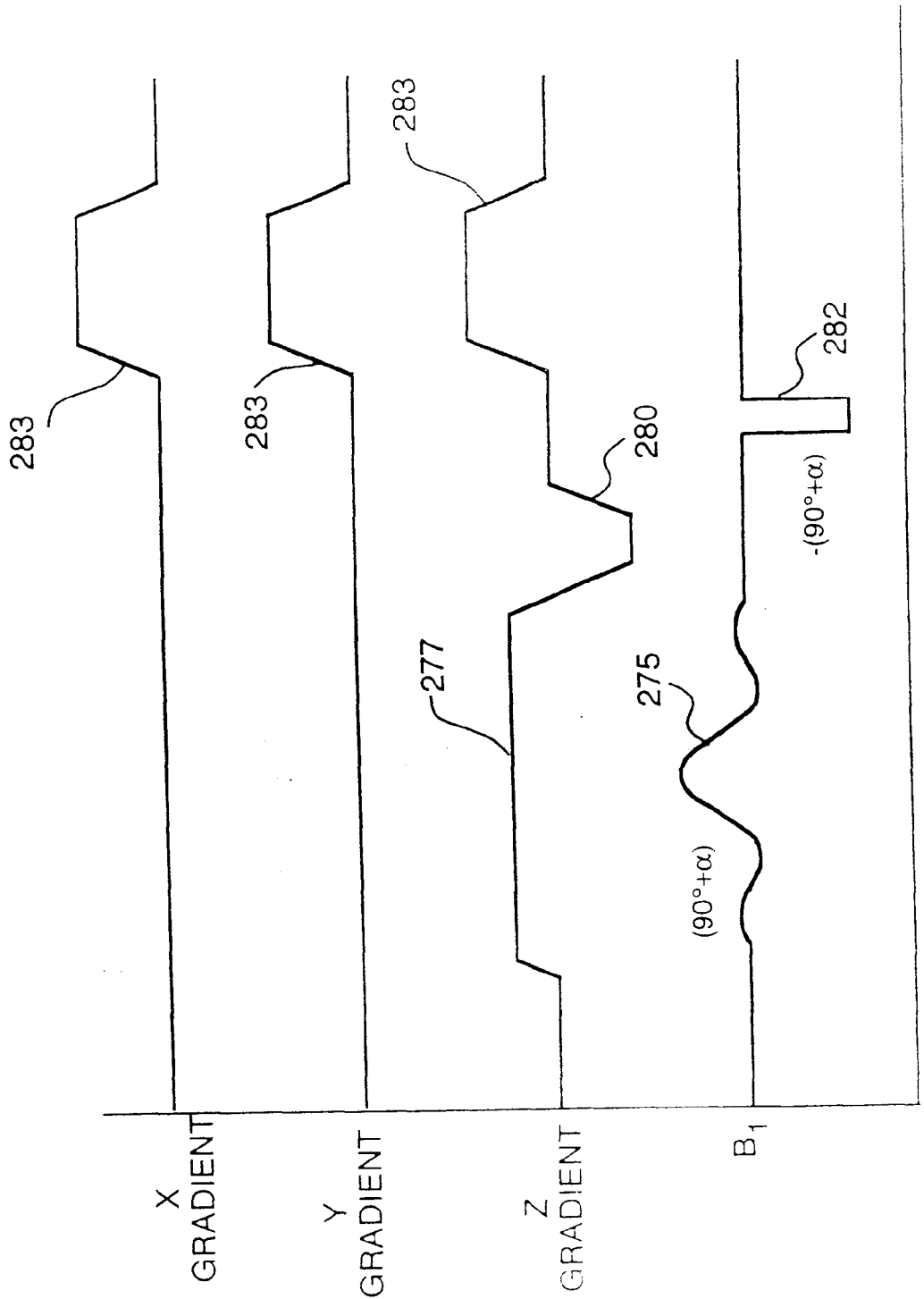
FIG. 6 is a graphical representation of a preparatory pulse sequence useful in the image acquisition sequence of FIG. 2.
Figure 7:
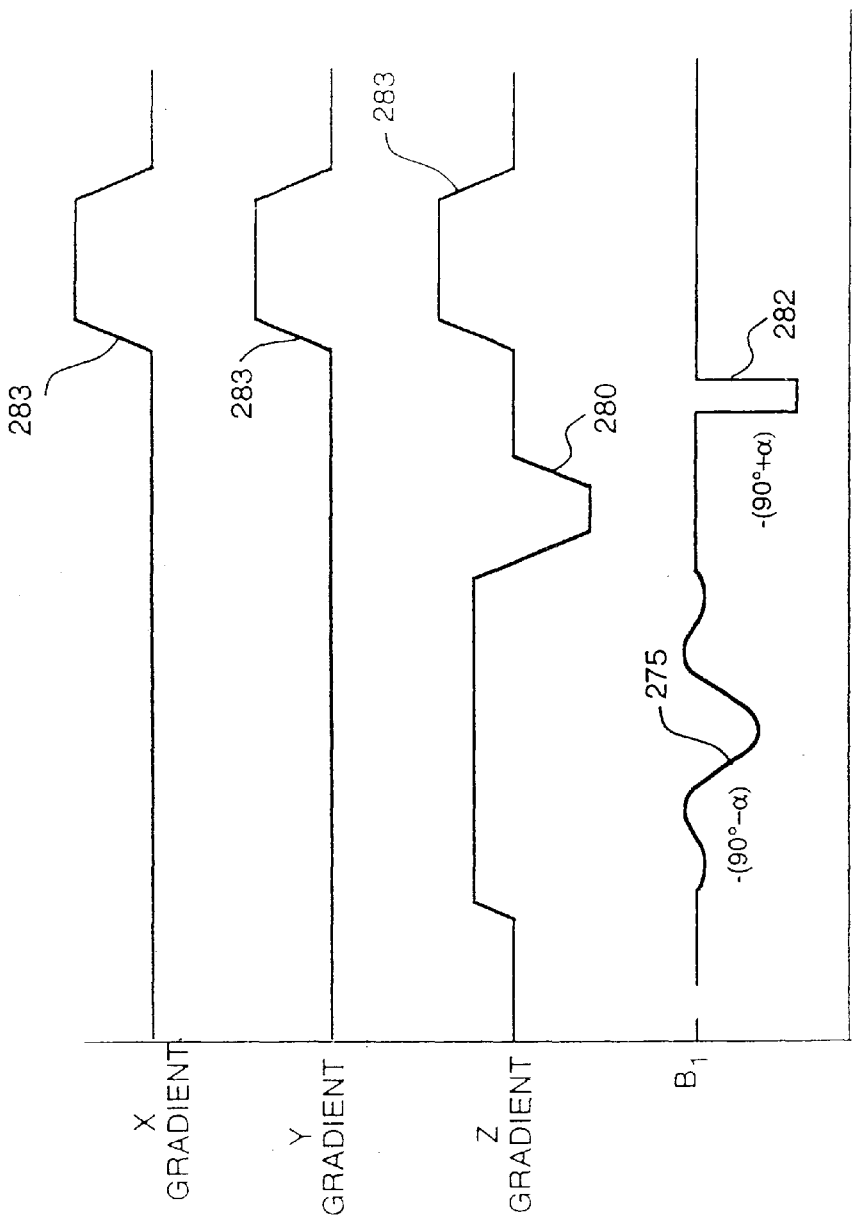
FIG. 7 is a graphical representation of another preparatory pulse sequence that useful in the image acquisition sequence of FIG. 2.

Referring particularly to FIGS. 3, 6 and 7, preparation pulse sequence 202 (FIG. 2) is adapted to saturate spin magnetization throughout the region of suppression (everywhere within volume 212 of FIG. 2 except slice 204) and includes application of a selective RF excitation pulse 275 produced in the presence of a slice-select gradient pulse 277 directed along the Z axis. Referring first to FIG. 6, RF excitation pulse 275 has a frequency content and amplitude selected to produce a flip-angle of (90+alpha) degrees in the spins located in slice 204. This transverse magnetization is rephased by a negative rephasing gradient pulse 280 directed along the Z-axis. A non-selective RF excitation pulse 282 is then produced to tip the spin magnetization throughout the entire volume by a flip angle of negative (90+alpha) degrees. This tips the spin magnetization in slice 204 back to the longitudinal Z-axis and leaves in the traverse plane the remaining spin magnetization on either side of slice 204. Spoiler gradient pulses 283, or gradient crusher pulses, are applied immediately thereafter in a known manner to dephase the transverse magnetization. As a result, only the spins located in slice 204 at time $t_0$ (FIG. 2) will have significant longitudinal magnetization when the subsequent imaging pulse sequences 210 (FIG. 2) are performed. Spins outside slice 204 are substantially saturated and do not produce a strong MR signal in response to the imaging pulse sequences.

There are many variations in the preparation pulse sequence. For example, the order of the selective RF pulse 275, and its associated gradient pulses 277 and 280 and non-selective RF pulse 282 may be reversed. Two separate selective RF excitation pulses that saturate spins on both sides of slice 204 may be used, or a single selective RF excitation pulse that simultaneously saturates spins on both sides of slice 204 may be used. The choice of method used depends to some extent on the thickness of slice 204 and the capabilities of the particular MRI system. To cover the entire left ventricle, for example, the preparation pulse sequence 202 is desirably applied multiple times to define a plurality of slices which together define a volume that includes the ventricle of interest.

The saturated spins outside slice 204 recover their longitudinal magnetization at a rate determined by their $T_1$ relaxation time. The value of alpha (a) for the RF excitation pulses 275 and 282 may be chosen such that the partially recovered longitudinal magnetization at one of the instants of image data acquisition 210 (FIG. 2) contributes minimally to the MR signal. It should be apparent that this method of suppressing signal from spins located outside slice 204 depends on the $T_1$ (or MR relaxation time) of the spins and the timing of the image acquisition. Referring to FIG. 2, for example, alpha can be selected such that optimal signal suppression is obtained with one of the imaging pulse sequences 210. However, potentially obscuring signals may still be present with the other imaging pulse sequences 210. If this is a problem, the value of alpha can also be changed during the scan to acquire optimally suppressed MR data at other cardiac phases. For example, the central k-space views for each cardiac phase image may be acquired with an optimum alpha suppression, and the peripheral k-space views may be acquired with less than optimal suppression.

A number of additional measures can be taken to further suppress the signal from spins outside slice 204. One of these methods involves combined use of preparatory pulse sequences shown in FIGS. 6 and 7. The preparatory pulse sequence in FIG. 7 is identical to that described above and shown in FIG. 6, except the flip angle of selective RF excitation pulse 275 is negative (90-alpha) degrees, and the flip angle of the non-selective RF excitation pulse 282 is negative (90+alpha) degrees. As a result, at the completion of this preparation pulse sequence, the spin magnetization outside slice 204 is saturated and the longitudinal magnetization of the spins inside slice 204 is inverted.

In this further variation of preparatory pulse sequence 202, the preparatory pulse sequences shown in FIGS. 6 and 7 are used in combination. Suppression of undesired signals is accomplished by using the preparatory pulse sequence of FIG. 6 (i.e. positive longitudinal magnetization) in one cardiac cycle and then acquiring the same image views during the next or alternate cardiac cycle using the preparatory pulse sequence of Figures (i.e. negative longitudinal magnetization). By performing a complex subtraction of the two acquired complex k-space data sets, the signals from in-slice spins will add while residual signals from spins outside slice 204 will subtract, or substantially null.

Other known variations of preparatory pulse sequence 202 include pre-imaging techniques often referred to as tagging. One very efficient pre-imaging scheme, called spatial modulation of magnetization (SPAMM), uses short RF pulses with interleaved gradient pulses to simultaneously generate a set of parallel tags. Some other schemes tag the myocardium with different patterns, e.g., radial tags, which are also suitable for examining the heart geometry.

Figure 8:
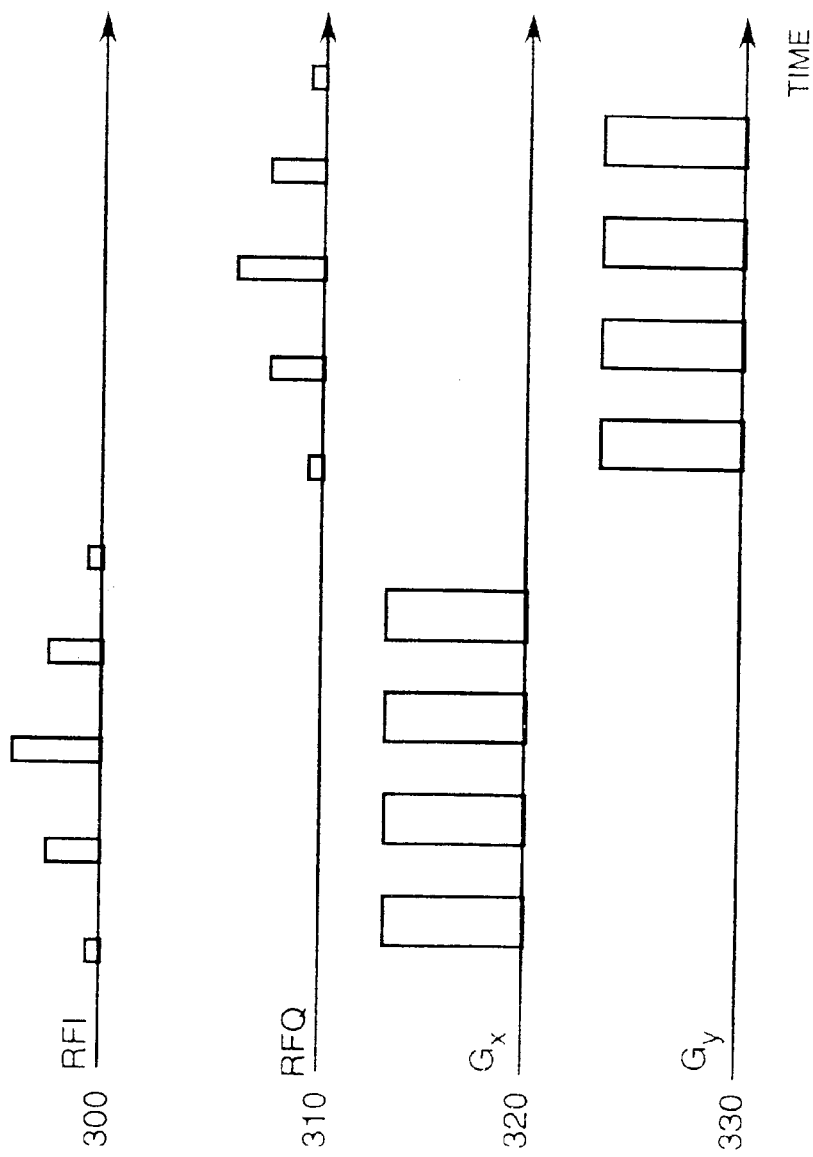
FIG. 8 is a graphical representation of a spatial modulation of magnetization (SPAMM) pre-imaging scheme of a type useful in image acquisition sequence of FIG. 2; and, FIG. 9 is a graphical representation of an embodiment of a preparatory pulse sequence of a type that is useful in a cardiac-triggered image acquisition sequence for in the MRI system of FIG. 1.

SPAMM is used to create two mutually orthogonal sets of planes of saturated magnetization, both orthogonal to the imaging plane, to produce a grid a tagging stripes in the image that can be used to track in-plane motion, such as heart wall motion. Referring to FIG. 8, a binomial SPAMM pulse sequence for two-dimensional grid formation prior to imaging is shown. It can be appreciated that other related selective excitation techniques could be similarly applied. RF in-phase (RFI) pulses 300 form a pulse sequence, the relative amplitudes of RF pulses 300 are distributed according to the binomial coefficients (such as 1-4-6-4-1 or 1-3-3-1). RF quadrature (RFQ) pulses 310 form a second pulse sequence. There is a phase shift of 90° from RFI pulses 300 to RFQ pulses 310 to avoid artifacts. Gradients 320 ($G_x$) and 330 ($G_y$) are orthogonal to produce orthogonal sets of stripes. Gradient pulses used for modulation have amplitude and duration such that the area under the pulse shape is inversely proportional to the desired stripe spacing. A brief delay between gradient pulses (320, 330) and RF pulses (300, 310) allows settling of the gradients. A two-dimensional array of stripes is imposed on an image to form a tagging grid and is produced by following an initial SPAMM sequence with a second one, with the second gradient 330 oriented in an orthogonal direction to the first gradient 320, as shown in FIG. 8. A resulting acquisition of two sets of tagged images in orthogonal planes, e.g. cardiac short- and long-axis-planes, offers the ability to quantitatively assess motion and deformation, particularly cardiac motion and myocardial function.

Radial tagging imposes a different grid pattern on an image and is produced in a similar manner to SPAMM tagging, with radial lines converging at the center of the left ventricle, in a short-axis slice. Slice select gradient pulses are selected in a known manner to impose the different grid pattern. Radial tagging is useful in studying contraction and relaxation of the heart, and measurement thereof. The grid reference forms a pattern of lines which, when later imaged, produces a reference void in the image.

Figure 9:
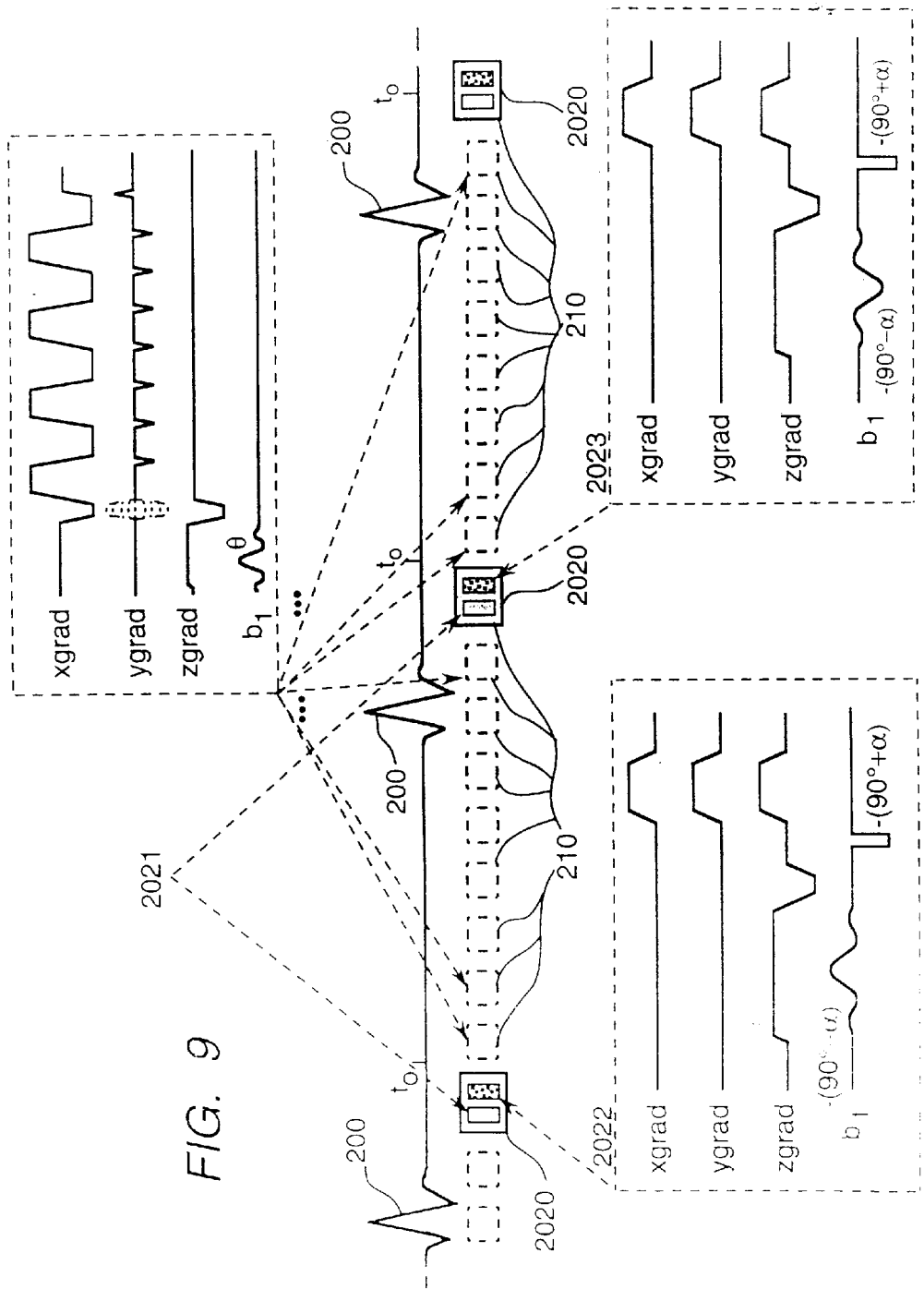

Referring to FIG. 9, in an embodiment of the present invention, a preparatory pulse sequence 2020 is adapted to simultaneously/concurrent y acquire a selected region of a moving and deforming object and impose a grid pattern on the selected region. Preparatory pulse sequence 2020 is an integrated pulse including a tagging sequence 2021 and a positive slice isolation sequence 2022 alternating with negative slice isolation sequence 2023 in alternate cardiac cycles. Tagging sequence 2021 is selected according to the tagging grid pattern desired, for example SPAMM or radial tagging. In this embodiment, tagging sequence 2021 is a SPAMM sequence as described with reference to FIG. 8. Positive slice isolation sequence 2022 and negative slice isolation sequence 2023, are the slice isolation sequences for saturating spins outside of a selected slice, as described with reference to FIGS. 6 and 7, respectfully. Referring further to FIG. 9, data acquisition is synchronized with a patient's cardiac cycle after the peak of R-waves 200. At a pre-selected time $t_0$ after each cardiac gating signal, a material slice of an object is selected. The material slice contains a myocardial region of interest, such as shown in FIG. 4 as 204. Thereafter preparation pulse sequence 2020 is performed by the MRI system.

In a first cardiac cycle and immediately after R-wave 200, tagging pulse sequences 2021 are applied to generate a grid pattern in material slice 204 (FIG. 3) and surrounding regions, for example the myocardium in this embodiment. Positive slice isolation sequence 2022 is then employed, in an integrated manner with tagging pulse sequence 2021, to saturate a selected volume except the specified material slice, as is described in FIG. 6. At each of a series of time instants following $t_0$, a projection image is generated by a series of imaging pulse sequences 210, as described in FIG. 5. In the next and alternate cardiac cycles, negative slice isolation sequence 2023, as described with reference to FIG. 7, is then employed in a similar integrated manner with tagging pulse sequence 2021. The resulting sets of acquired image data are thereafter subtracted, as described with reference to FIGS. 6 and 7, and reconstructed according to known reconstruction techniques. The reconstructed data results in a sequence of images that capture the moving and deforming material slice and imposed tags, shown in FIG. 4 as 208 and 218, respectfully. Thus, a material region initially tagged and its projection are imaged. This embodiment enables time-resolved imaging of MR-tagged myocardial region. Projection imaging keeps the moving and deforming region of interest in view, and data acquisition is accomplished by spatial encoding in two dimensions thus reducing scan time, since conventional volumetric imaging requires spatial encoding in three dimensions.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for producing an image of a selected region of interest included in a volume within a moving and deforming object in a Magnetic Resonance Imaging (MRI) system, said method comprising:

applying at least one integrated preparatory pulse sequence to said region of interest prior to at least one subsequent imaging sequence, said integrated preparatory pulse sequence adapted to simultaneously alter longitudinal magnetization of spins located outside of said selected region and to further impose a grid pattern on said selected region; wherein said integrated preparatory pulse sequence includes applying an RF pulse sequence, said RF pulse sequence adapted to produce a flip angle in the spins located inside the selected region.

2. The method of claim 1 wherein said imposed grid pattern is generated by a spatial modulation of magnetization (SPAMM) tagging pulse sequence.

3. The method of claim 1 wherein said imposed grid pattern is generated by a radial tagging pulse sequence.

4. The method of claim 1 further comprising:

forming at least one set of image data being acquired from a plurality of imaging sequences; and, reconstructing said at least one set of acquired image data of said selected region of interest.

5. The method of claim 4 wherein said image data is acquired using a projection imaging technique.

6. The method of claim 1 wherein the object is a short-axis segment of a left ventricle of a beating heart.

7. The method of claim 1 wherein the object is a long-axis segment of a left ventricle of a beating heart.

8. The method of claim 1, wherein the flip angle is a non zero value.

9. A method of producing an image of a selected region of interest within a moving and deforming object in a Magnetic Resonance Imaging (MRI) system, said method comprising:

a) applying a first integrated preparatory pulse sequence) to said region of interest pulse responsive to a cardiac cycle reference signal and prior to an imaging pulse sequence said first integrated preparatory pulse sequence adapted to simultaneously suppress longitudinal magnetization of spins located outside of said selected region and to further impose a grid pattern on said selected region; wherein said integrated preparatory pulse sequence includes applying an RF pulse sequence, said RF pulse sequence adapted to produce a flip angle in the spins located inside the selected region;

b) applying a second integrated preparatory pulse sequence to said region of interest responsive to a subsequent cardiac cycle reference signal and prior to a subsequent imaging pulse sequence, said second integrated preparatory pulse sequence adapted to simultaneously suppress longitudinal magnetization of spins located outside of said selected region and to further impose said grid pattern on said selected region, said second integrated preparatory pulse sequence being further adapted to combine with said first integrated preparatory pulse sequence to substantially isolate said selected region of interest; and, c) acquiring, subtracting, and reconstructing respective sets of image data from said respective cardiac cycles to generate at least one image of said isolated selected region of interest within said moving and deforming object.

10. The method of claim 9 wherein the object is a short-axis segment of a left ventricle of a beating heart.

11. The method of claim 9 wherein the object is a long-axis segment of a left ventricle of a beating heart.

12. The method of claim 9 wherein said imposed grid pattern is generated by a spatial modulation of magnetization (SPAMM) tagging pulse sequence.

13. The method of claim 9 wherein said imposed grid pattern is generated by a radial tagging pulse sequence.

14. The method of claim 9 wherein said acquisition of said image data is acquired using a projection imaging technique.

15. The method of claim 9 wherein said generated image is displayed.

16. The method of claim 9, wherein the flip angle is a non zero value.

* * * * *